US009524904B2

United States Patent
Ohori et al.

(10) Patent No.: US 9,524,904 B2
(45) Date of Patent: Dec. 20, 2016

(54) EARLY BIT LINE AIR GAP FORMATION

(71) Applicant: SanDisk Technologies Inc., Plano, TX (US)

(72) Inventors: Hiroto Ohori, Yokkaichi (JP); Takuya Futase, Yokkaichi (JP); Yuji Takahashi, Yokkaichi (JP); Toshiyuki Sega, Yokkaichi (JP); Kiyokazu Shishido, Yokkaichi (JP); Kotaro Jinnouchi, Yokkaichi (JP); Noritaka Fukuo, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 14 days.

(21) Appl. No.: 14/520,117

(22) Filed: Oct. 21, 2014

(65) Prior Publication Data

US 2016/0111326 A1    Apr. 21, 2016

(51) Int. Cl.
*H01L 21/768* (2006.01)
*H01L 23/48* (2006.01)

(52) U.S. Cl.
CPC ..... *H01L 21/76843* (2013.01); *H01L 21/7682* (2013.01); *H01L 21/76802* (2013.01); *H01L 21/76877* (2013.01)

(58) Field of Classification Search
CPC ............... H01L 21/764; H01L 21/7682; H01L 27/10885; H01L 27/1157; H01L 27/11529; H01L 29/0649
See application file for complete search history.

(56) References Cited

U.S. PATENT DOCUMENTS

| | | | |
|---|---|---|---|
| 7,737,015 B2 | 6/2010 | Kohli et al. |
| 7,795,080 B2 | 9/2010 | Orimoto et al. |
| 7,800,155 B2 | 9/2010 | Matsuno |
| 7,863,190 B1 | 1/2011 | Papasouliotis |
| 7,884,415 B2 | 2/2011 | Nagano |
| 7,905,959 B2 | 3/2011 | Tzu et al. |
| 8,053,347 B2 | 11/2011 | Kang et al. |
| 8,129,264 B2 | 3/2012 | Kim et al. |
| 8,362,542 B2 | 1/2013 | Kang et al. |
| 8,383,479 B2 | 2/2013 | Purayath |
| 8,492,224 B2 | 7/2013 | Purayath et al. |
| 8,546,239 B2 | 10/2013 | Harari et al. |
| 8,603,890 B2 | 12/2013 | Purayath et al. |
| 2006/0194390 A1 | 8/2006 | Imai et al. |
| 2007/0184615 A1 | 8/2007 | Brazzelli et al. |
| 2007/0257305 A1 | 11/2007 | Sasago et al. |
| 2008/0003743 A1 | 1/2008 | Lee |
| 2008/0283898 A1 | 11/2008 | Kuniya |
| 2009/0212352 A1 | 8/2009 | Aoyama et al. |
| 2009/0267131 A1 | 10/2009 | Nitta |
| 2010/0019311 A1 | 1/2010 | Sato et al. |
| 2010/0127320 A1 | 5/2010 | Nishihara et al. |
| 2010/0230741 A1 | 9/2010 | Choi et al. |
| 2011/0057250 A1 | 3/2011 | Higashi |

(Continued)

*Primary Examiner* — Pamela E Perkins
(74) *Attorney, Agent, or Firm* — Davis Wright Tremaine LLP

(57) ABSTRACT

Dummy bit lines of are formed in a sacrificial layer at locations where bit lines are to be formed, with bit lines separated by trenches that extend through the sacrificial layer. Enclosed air gap structures are formed in the trenches between the dummy bit lines. Subsequently, the dummy bit lines are replaced with metal to form bit lines.

26 Claims, 12 Drawing Sheets

(56) References Cited

U.S. PATENT DOCUMENTS

2011/0303967 A1    12/2011  Harari et al.
2011/0309430 A1    12/2011  Purayath et al.
2013/0267088 A1*  10/2013  Baek ................. H01L 21/76802
                                                               438/637

* cited by examiner

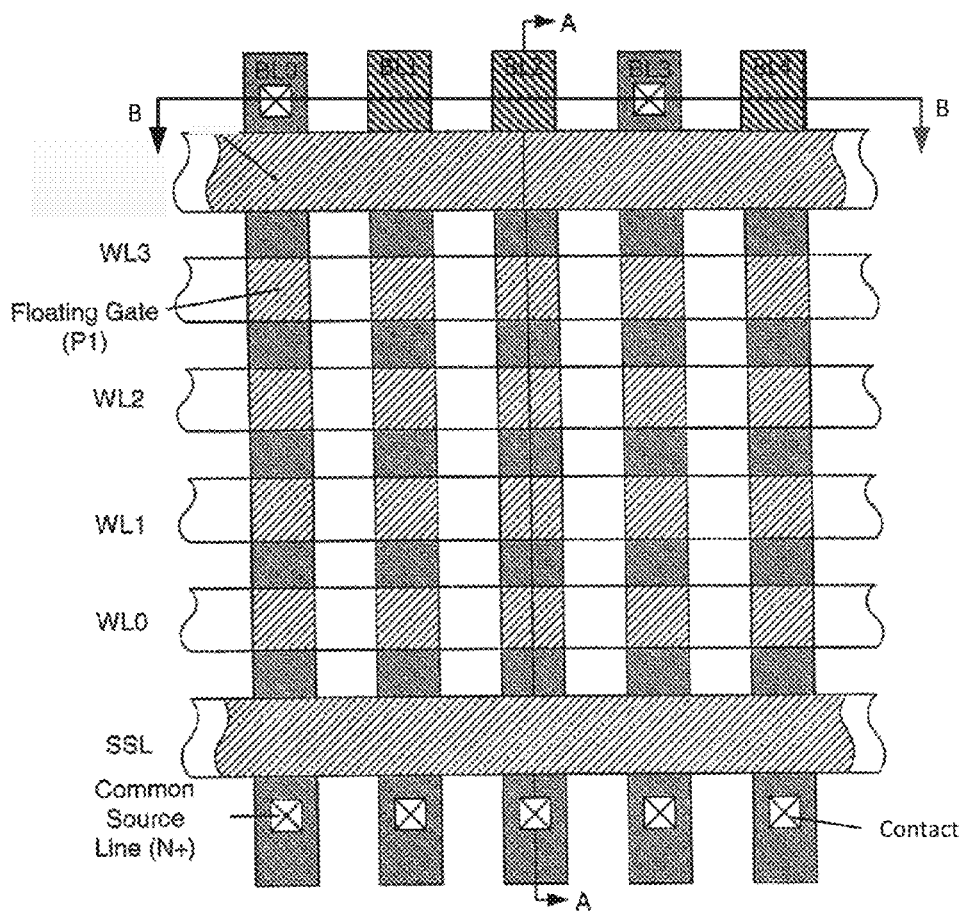
FIG._ 2A *(PRIOR ART)*
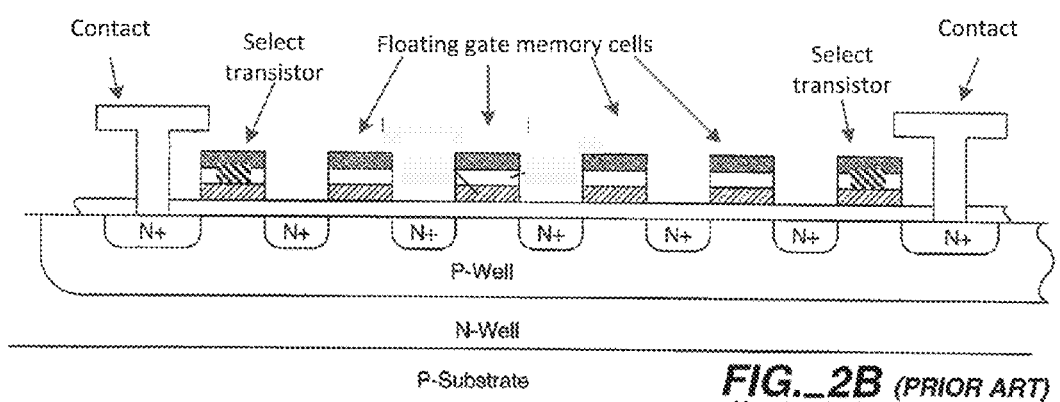
FIG._ 2B *(PRIOR ART)*
(Section A-A)

(Section B-B)

EARLY BIT LINE AIR GAP FORMATION

BACKGROUND

This specification relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

NAND strings are generally connected by conductive lines in order to form arrays that may contain many NAND strings. At either end of a NAND string a contact area may be formed. This allows connection of the NAND string as part of the array. Metal contacts may be formed over contact areas to connect the contact areas (and thereby connect NAND strings) to conductive metal lines that extend over the memory array (e.g. bit lines). FIG. 2A shows bit line contacts BL0-BL4 and common source line contacts at either end of NAND strings. Contacts to contact areas may be formed by etching contact holes through a dielectric layer and then filling the holes with metal. Metal lines, such as bit lines, extend over the memory array and in peripheral areas in order to connect the memory array and various peripheral circuits. These metal lines may be close together (particularly in the memory array area where bit lines may be very close) which tends to make processing difficult and provides a risk of capacitive coupling. The characteristics of such lines (e.g. resistance and capacitance) may affect memory operation.

Thus, there is a need for a memory chip manufacturing process that forms uniform low resistance conductive lines, such as bit lines, in close proximity in an efficient manner.

SUMMARY

According to an example of formation of a memory integrated circuit, air gaps are formed between bit lines to reduce bit line-to-bit line capacitance. Dummy bit lines may be formed by patterning a layer of sacrificial material into dummy bit lines separated by trenches. Then, air gap structures may be formed in the trenches between dummy bit lines. Subsequently, the dummy bit lines may be replaced with actual bit lines (i.e. sacrificial material may be removed and metal and barrier layers may be deposited and planarized). By forming air gap structures before bit lines are formed, exposure of bit lines to etching may be reduced or eliminated thereby improving bit line quality. An etch stop layer may provide uniform trench depth for trenches and air gap structures. The etch stop layer may be below the sacrificial layer so that air gaps extend below the bit lines to provide low coupling. Trench profiles may be controlled by etch process parameters. In another example, dummy bit lines are formed in a damascene process (deposited in trenches) instead of by etching.

An example of a method of forming air gap structures between conductive lines includes: forming a first layer; forming a second layer on the first layer; patterning the second layer using a selective etch that provides an etch rate of the second layer that is substantially higher than an etch rate of the first layer thereby forming a first trench in the second layer at a location where an air gap between conductive lines is to be formed; depositing a third layer in the first trench the third layer encapsulating an air gap in the first trench; removing the patterned second layer to form a second trench while the air gap remains in place; depositing a barrier layer and conductive line metal in the second trench; and performing Chemical Mechanical Polishing (CMP) to remove excess conductive line material while leaving conductive line material in the second trench to form a conductive line.

The at least a portion of the third layer may be removed prior to removing the patterned second layer. The at least a portion of the third layer that is removed may extend over the patterned second layer and removing the at least a portion of the third layer may expose the patterned second layer. The first trench may extend into the first layer and end within the first layer. The first trench may extend lower than a bottom surface of the conductive line. A buffering layer may be formed on the second layer, and prior to removing the patterned second layer to form the second trench, excess material of the third layer may be removed from over the buffering layer on the patterned second layer using an etch that has a significantly higher etch rate for material of the third layer than for material of the buffering layer. The third layer may be a composite layer formed of two or more individual layers and formation of the third layer include: depositing an encapsulating layer in the first trench; and subsequently depositing a filling layer over the encapsulating layer, the filling layer having a higher filling efficiency than the encapsulating layer. The selective etch may use an etch chemistry that has a significant etch rate for material of the barrier layer. The etch chemistry may be such that the selective etch is corrosive to material of the barrier layer. The barrier layer may include titanium. The first trench may be shaped so that width of the first trench increases with increasing depth. Performing CMP may remove material down to a level that is higher than the air gap and may not expose the air gap. Performing CMP may remove material down to a level that is lower than an uppermost point in the air gap thereby exposing the air gap, and a capping layer may subsequently be deposited to re-enclose the air gap.

An example of a method of forming bit lines of a nonvolatile memory includes: forming a plurality of dummy bit lines in a sacrificial layer of sacrificial material at locations where a plurality of bit lines are to be formed, the plurality of dummy bit lines separated by a plurality of trenches that extend through the sacrificial layer; subsequently forming a plurality of enclosed air gap structures in the plurality of trenches; and subsequently replacing the plurality of dummy bit lines with metal to form the plurality of bit lines.

Replacing the plurality of dummy bit lines may include: performing a selective etch to remove the plurality of dummy bit lines without significant etching of an underlying layer and without significant etching of the plurality of enclosed air gap structures; subsequently depositing a layer of metal that fills openings where dummy bit lines were removed and that overlies the plurality of enclosed air gap structures; and subsequently performing planarization to remove excess metal while leaving metal in the openings to form the plurality of bit lines. The planarization may remove material of the plurality of enclosed air gap structures and a cap layer may subsequently be deposited to re-enclose the plurality of enclosed air gap structures. The trenches may extend through an underlying layer that underlies the sacrificial layer, the trenches may stop at an etch stop layer located below the underlying layer, the underlying layer and etch stop layer formed of different materials that are not the sacrificial material. The sacrificial material may be amorphous silicon, the underlying layer may be formed of silicon oxide and the etch stop layer may be formed of silicon nitride. Replacing the dummy bit lines may include: etching substantially all amorphous silicon of the sacrificial layer using an etch that selectively removes amorphous silicon without substantially etching the underlying layer of silicon oxide; and subsequently depositing the metal on the underlying layer of silicon oxide. Forming the plurality of enclosed air gap structures in the plurality of trenches may include: forming a liner layer on exposed surfaces of the trenches; subsequently forming an air gap encapsulating layer on the liner layer; subsequently forming a cap layer on the encapsulating layer; and subsequently performing an etch back step.

Forming the plurality of dummy bit lines of sacrificial material at locations where the plurality of bit lines are to be formed may include: patterning an underlying sacrificial layer to form elongated openings in the underlying sacrificial layer at locations where the plurality of bit lines are to be formed; filling the elongated openings with the sacrificial material; planarizing the sacrificial material; and removing the underlying sacrificial layer to leave the dummy bit lines. Forming the plurality of dummy bit lines of sacrificial material at locations where the plurality of bit lines are to be formed may include: depositing a sacrificial layer of the sacrificial material; and subsequently patterning and etching the sacrificial layer into the plurality of dummy bit lines.

An example of a method of forming bit lines of a nonvolatile memory includes: forming a first sacrificial layer of a first sacrificial material; patterning the first sacrificial layer of the first sacrificial material to form a first plurality of trenches at locations where bit lines are to be formed; subsequently depositing a second sacrificial material in the first plurality of trenches and over the patterned first layer of the first sacrificial material; subsequently planarizing the second sacrificial layer to expose portions of the first sacrificial layer; selectively removing the first sacrificial material to leave portions of the second sacrificial material as dummy bit lines at locations where bit lines are to be formed; subsequently forming a plurality of enclosed air gap structures between dummy bit lines; and subsequently replacing dummy bit lines with metal to form the bit lines.

The first plurality of trenches may be tapering trenches that become narrower as with increasing depth. The plurality of enclosed air gap structures may be wider along a bottom surface than along a top surface. An etch stop layer that underlies the first sacrificial layer may be patterned with the first sacrificial layer so that the first plurality of trenches extend through the etch stop layer. Forming the first plurality of trenches may expose portions of an underlying dielectric layer and may expose vias in the underlying dielectric layer. The first sacrificial material may be silicon nitride, the second sacrificial material may be amorphous silicon, the etch stop layer may be formed of silicon oxide, and the underlying dielectric layer may be formed of silicon oxide.

Various aspects, advantages, features and embodiments are included in the following description of examples, which description should be taken in conjunction with the accompanying drawings.

BRIEF DESCRIPTION OF THE DRAWINGS

FIG. 2A is a plan view of a prior art NAND array.
FIG. 2B shows a cross section of the NAND array of FIG. 2A.

DETAILED DESCRIPTION OF EXEMPLARY EMBODIMENTS

Memory System

Figure 1:
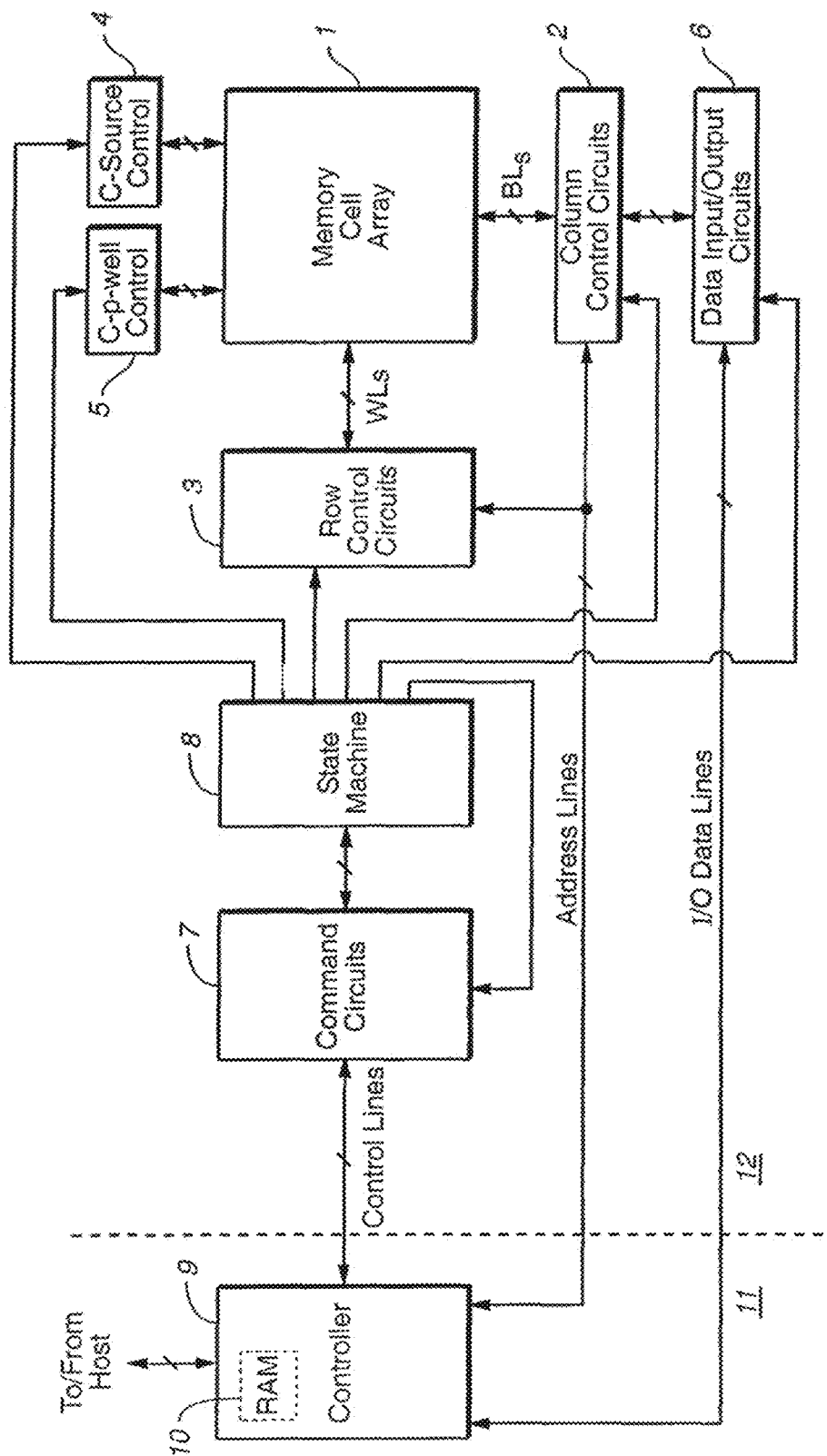
FIG. 1 is a block diagram of a prior art memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Examples of memory arrays are not limited to the two dimensional and three dimensional exemplary structures described here and may include various arrangements of memory cells using various physical phenomena to store data.

An example of a prior art memory system, which may be modified to include various techniques described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertable into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Figure 2C:
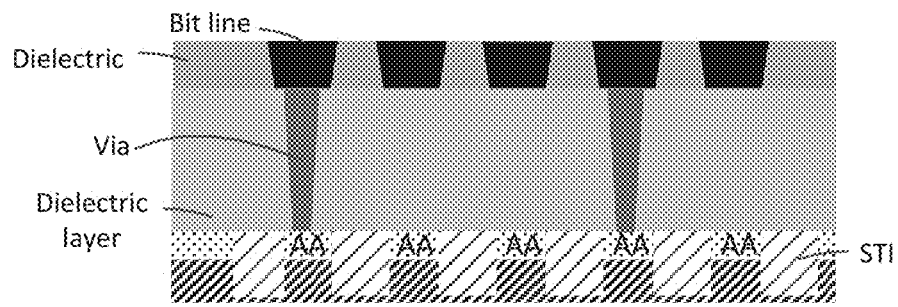
FIG. 2C shows another cross section of the NAND array of FIG. 2A.

FIGS. 2A-2C show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contacts, or vias, are formed at either end to connect the NAND strings in the memory array to conductive lines (e.g. connecting to bit lines at one end and to a common source line at the other end). Such a via may be formed of metal that is deposited into a contact hole that is formed in a dielectric layer. FIG. 2C shows a cross section along B-B of FIG. 2A. This view shows metal vias extending down through contact holes in a dielectric layer to make contact with active areas ("AA") in the substrate (i.e. with N+ areas of FIG. 2B). STI regions are located between active areas of different strings to electrically isolate an individual NAND string from its neighbors. Bit lines extend over the memory array in a direction perpendicular to the cross section shown. Two bit lines are connected to vias in the cross section shown. (It will be understood that other vias, that are not visible in the cross section shown, connect the remaining bit lines to other active areas). In this arrangement, locations of vias alternate so that there is more space between vias and thus less risk of contact between vias. Other arrangements are also possible.

As memories become smaller, the spacing between bit lines tends to diminish. Accordingly, capacitive coupling between bit lines tends to increase as technology progresses to ever-smaller dimensions. FIG. 2C shows bit lines formed in a dielectric material. For example, copper bit lines may be formed by a damascene process in which elongated openings, or trenches, are formed in the dielectric layer and then copper is deposited to fill the trenches. When excess copper is removed (e.g. by Chemical Mechanical Polishing, CMP) copper lines remain. A suitable dielectric may be chosen to keep bit line-to-bit line capacitance low.

One way to reduce bit line-to-bit line coupling is to provide an air gap between neighboring bit lines. Thus, rather than maintain dielectric portions between bit lines, the bit lines are formed in a sacrificial layer which is then removed to leave air gaps between bit lines.

Removing sacrificial material between bit lines generally requires some form of etching which may expose bit lines to etch-related damage. While a suitable combination of sacrificial material and etch chemistry may be chosen so that sacrificial material is etched at a higher rate than bit line metal and/or barrier material, some etching or corrosion of bit line metal and/or barrier metal may occur and bit lines may be damaged accordingly.

Figure 3:
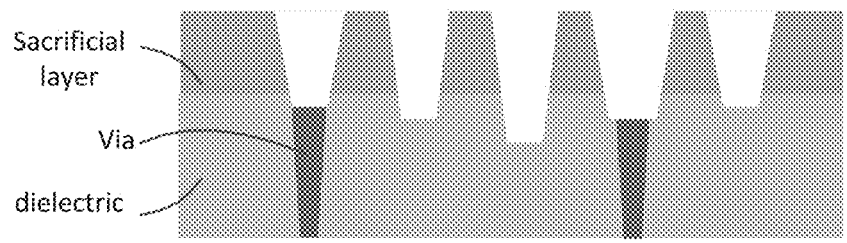
FIG. 3 illustrates an example of formation of trenches for damascene bit lines.

FIG. 3 shows a cross section of a memory die at an intermediate stage of fabrication where bit lines are being formed. In this example, bit lines are formed in a damascene process in which trenches are formed in a sacrificial layer (e.g. silicon oxide) as shown by patterning and etching. Trench depth may be variable because of nonuniform etching of different trenches. Subsequently, when these trenches are filled with metal to form bit lines, the bit lines may be nonuniform as shown in FIG. 4.

Figure 4:
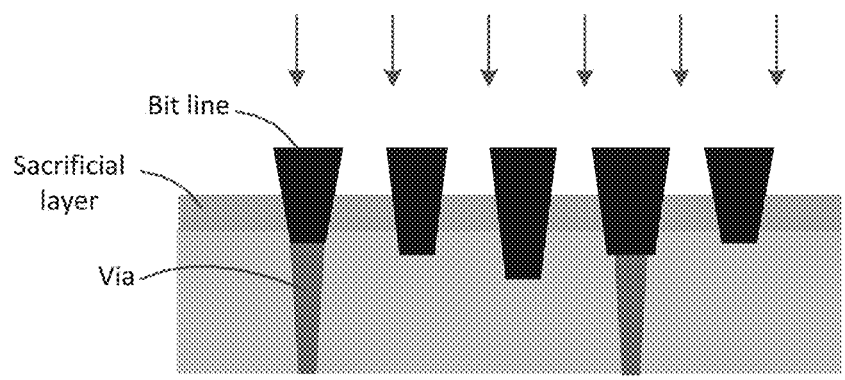
FIG. 4 illustrates bit lines formed in the trenches of FIG. 3.

FIG. 4 shows the die of FIG. 3 during an etch step that removes sacrificial material to form air gaps between bit lines. Because bit lines are of unequal depth there may be a risk of etching extending below the level of some shallower bit lines. This could undercut bit lines causing them to lift off. To ensure that this does not occur, the etch depth when removing sacrificial material may be reduced to a depth that ensures that the shallowest bit lines remain attached. However, this may leave significant sacrificial material between bit lines so that gaps between bit lines have more dielectric (and less air gap) than is desirable. This may produce significant capacitive coupling between bit lines.

While removing sacrificial material the etch may also remove some bit line metal and/or barrier layer material, or corrode, or otherwise damage bit lines. In some areas, bit lines may be etched through, which may result in a broken bit line. In other areas, cross sectional area of bit lines may be reduced leading to high resistance which may result in poor operation and may lead to failure over time. Conductive lines other than bit lines may also be affected. For example, conductive lines in the periphery of a memory array may connect peripheral circuits and may also be affected. It is generally desirable to maintain conductive lines, including bit lines, intact throughout removal of sacrificial material to form air gaps.

An etch stop layer is an example of a structure that may be used to establish a uniform etch depth. In general, an etch stop layer is a layer of material that has a low etch rate for the particular etch chemistry being used (thus an etch stop layer is generally specific to etch chemistry). When etching through silicon oxide (e.g. SiO2) using anisotropic etching (e.g. RIE) silicon nitride (e.g. SiN) may be used as an etch stop layer (a different etch stop layer may be appropriate when etching through some other layer, or using some other etch chemistry).

Figure 5A:
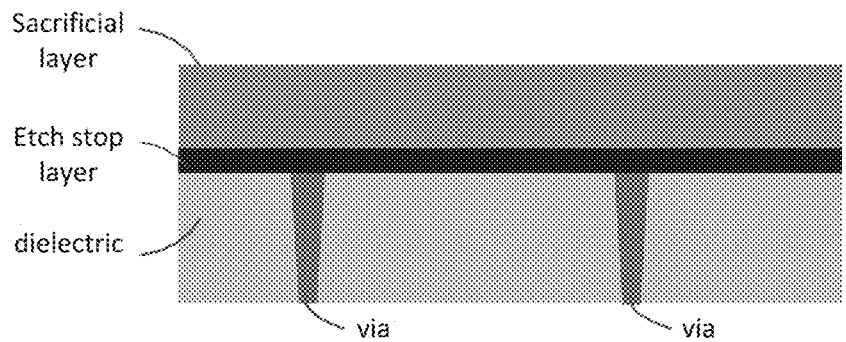
FIGS. 5A and 5B illustrate examples of etch stop layers.

FIG. 5A shows an example of an etch stop layer that may be used to stop etching of trenches at a uniform depth across a substrate (i.e. at different locations across a silicon wafer). The etch stop layer overlies metal vias and the dielectric layer in which vias are formed in this example. In some cases, both the sacrificial layer and the dielectric layer are formed of the same material (e.g. silicon oxide). In other cases, these materials may be different.

Figure 5B:
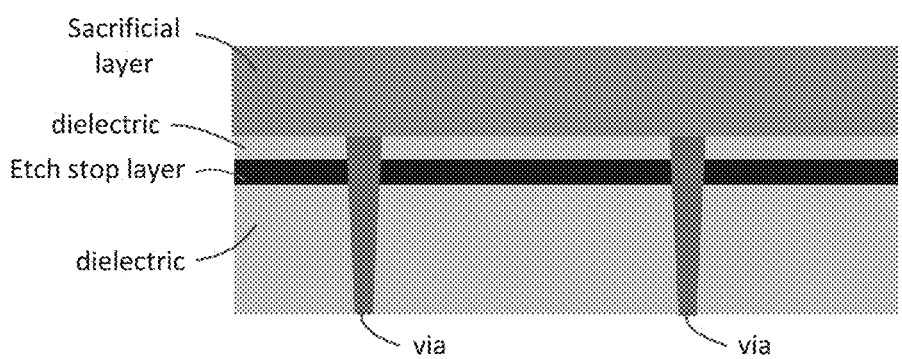

FIG. 5B shows an alternative location for an etch stop layer that is within the dielectric in which vias are formed (i.e. the dielectric layer is formed in two sub-layers one below the etch stop layer and one above). The vias extend through the etch stop layer in this example and the vias extend somewhat above the etch stop layer. Making contact with the vias may later be achieved without etching through the etch stop layer. In some cases, the sacrificial layer and the dielectric layer may be formed of different materials so that the sacrificial material may be selectively removed without significantly etching the dielectric layer (i.e. the dielectric layer may act as an etch stop when removing sacrificial material). Etch stop layers may be used at other locations in other examples. In some cases no etch stop layer is used because sufficient uniformity is achieved based on a timed etch or some end-point detection or other technique.

Figure 6:
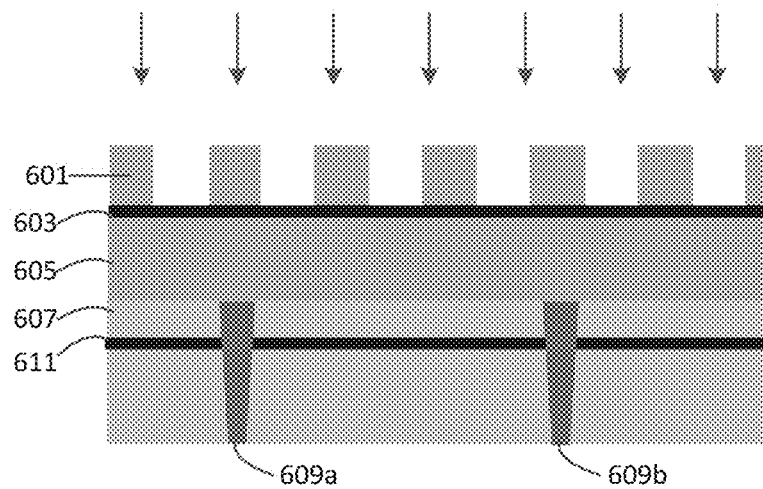
FIG. 6 illustrates a cross section of a portion of a memory die at an intermediate stage of fabrication.

FIG. 6 shows a memory die at an intermediate stage of fabrication according to an example. Underlying layers (including active areas of memory cells, STI areas, etc.) are not shown and it will be understood that the structure shown represents only a portion of the die (a portion where bit lines are to be formed) and that other portions may be formed in any suitable arrangement according to any suitable process. A patterned layer 601 is shown as multiple patterned portions (e.g. portions of hard mask material that were patterned by photolithography and etching). The patterned layer 601 overlies a buffering layer 603 (or "end-point layer") on a sacrificial layer 605. In some cases, such a buffering layer may not be used and the patterned layer may directly overlie the sacrificial layer. The sacrificial layer 605 overlies the dielectric layer 607 and the vias 609a-b. In this example, an etch stop layer 611 is located under dielectric layer 607. In other examples, no etch stop layer may be provided, or an etch stop layer may be provided at a different location (e.g. overlying the dielectric layer and vias). It can be seen that portions of hard mask material overlie vias 609a-b in this example so that these areas, and other areas where bit lines are to be formed, are protected from etching. The areas that are exposed to etching are between future bit line locations.

Various materials may be used to form the layers shown. For example, patterned layer 601 may be formed of a suitable hard mask material such as silicon oxide (e.g. SiO2). Buffering layer 603 may be formed of silicon nitride (SiN). Sacrificial layer 605 may be formed of amorphous silicon. Dielectric layer 607 may be formed of silicon oxide (e.g. deposited by CVD process using TEOS). Etch stop layer 611 may be formed of silicon nitride (SiN). Other suitable materials may also be used. The term "silicon oxide" refers to any oxide of silicon, not only stoichiometric SiO2. The term "silicon nitride" refers to any nitride of silicon, not only stoichiometric SiN.

Figure 7:
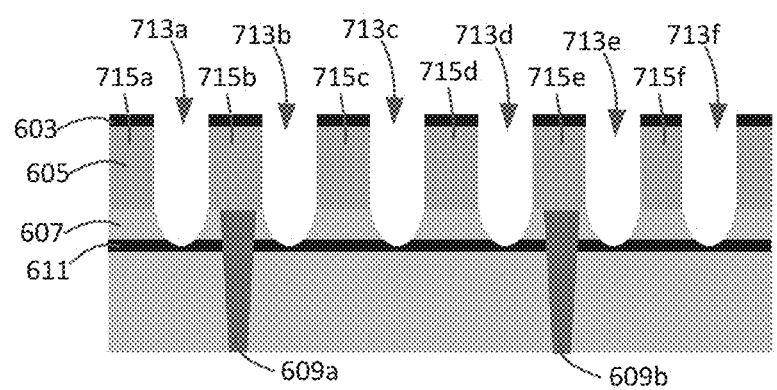
FIG. 7 illustrates the memory die of FIG. 6 after etching of trenches.

FIG. 7 shows trenches 713a-f that are formed by the etching step of FIG. 6. It can be seen that locations of trenches are between future bit line locations. Unlike the trenches of FIG. 3 which are aligned with vias and are located where bit lines are to be formed, trenches 713a-f are aligned with locations between bit lines where isolation is to be provided between bit lines. Portions of sacrificial material 715a-f remain at locations where bit lines are to be formed and may be considered as dummy bit lines. Dummy bit lines 715a-f occupy locations where bit lines are to be formed during the formation of adjacent air gap structures. The patterned layer 601 has been removed in this view so that buffering layer 603 is exposed.

FIG. 7 shows trenches 713a-f stopping at etch stop layer 611 so that trenches extend below the bottom of sacrificial layer 605 and below the tops of vias 609a-b. Trenches 713a-f may be formed with uniform depth using such an etch stop layer. Trenches 713a-f are shown having a rounded profile at the bottom. This profile may be configurable by choosing appropriate etch parameters (i.e. process may be tuned to achieve this shape or some other shape at the bottoms of trenches).

Figure 8:
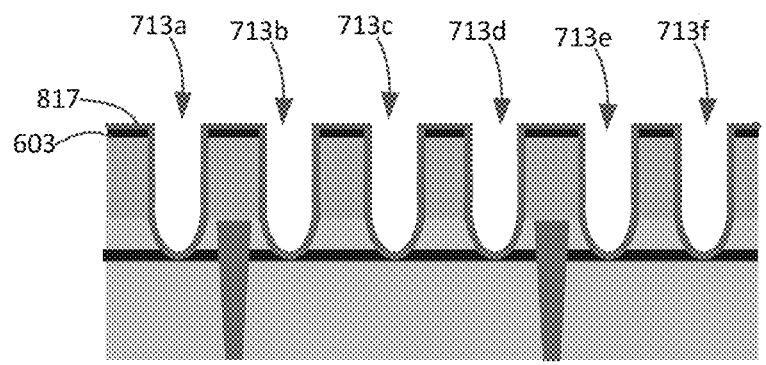
FIG. 8 illustrates the memory die of FIG. 7 after deposition of a liner layer.

FIG. 8 shows the memory die of FIG. 7 after formation of a liner layer 817 that extends along surfaces of trenches 713a-f and over the exposed portions of the buffering layer 603 between trenches 713a-f. Liner layer 817 may be formed of silicon oxide formed by a suitable process. For example, Atomic Layer Deposition (ALD) may be used to deposit a liner layer of silicon oxide.

Figure 9:
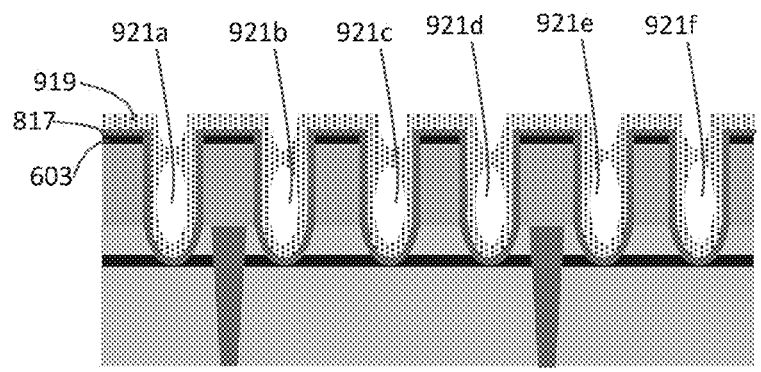
FIG. 9 illustrates the memory die of FIG. 8 after formation of an air gap encapsulating layer.

FIG. 9 shows the memory die of FIG. 8 after formation of an air gap encapsulating layer 919. The air gap encapsulating layer 919 covers surfaces of the trenches with material of the air gap encapsulating layer pinching off the openings at tops of trenches so that an air gap 921a-f is encapsulated in each trench as shown. Each air gap 921a-f contains air (or some other gas) and is encapsulated so that it is isolated from the surrounding air (or other ambient gas). An example of an air gap encapsulating layer is a layer of silicon oxide formed using silane (SiH4) in a plasma Chemical Vapor Deposition (CVD) process. In general, such a process may be tuned so that material pinches off trench openings before the trenches are filled thus forming encapsulated air gaps. A process may be chosen that has a low filling efficiency and tends to form voids, or air gaps, e.g. because of a higher deposition rate at openings of trenches than at bottoms of trenches.

Figure 10:
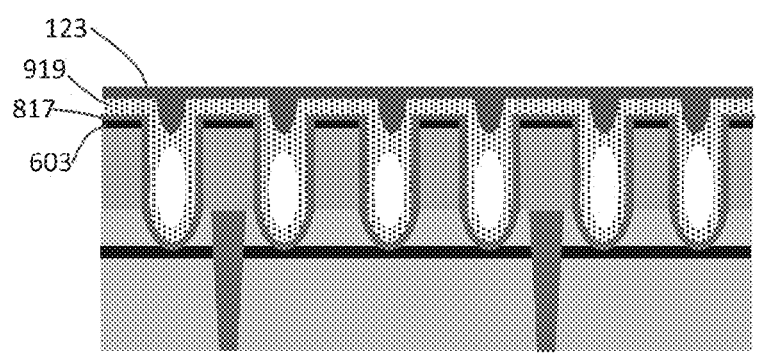
FIG. 10 illustrates the memory die of FIG. 9 after formation of a filler layer.

FIG. 10 shows the memory die of FIG. 9 after deposition of a filling layer 123 over the air gap encapsulating layer 921. While the air gap encapsulating layer 921 may be formed by a process with low filling efficiency so that trenches are not filled (i.e. voids, or air gaps, are intentionally formed) the filling layer 123 may be formed by a process with a high filling efficiency so that gaps or depressions in the air gap encapsulating layer are filled. For example, such a process may have a high deposition rate at the bottoms of trenches compared with tops of trenches. In particular, depressions over air gaps may be filled and the resulting structure may be substantially planar as shown. This facilitates subsequent etching back because it provides a more uniform geometry and generally protects air gaps that might be exposed by subsequent etching if they were not adequately protected. An example of a filling layer is silicon oxide formed at low temperature (Low Temperature Oxide, or "LTO").

Figure 11:
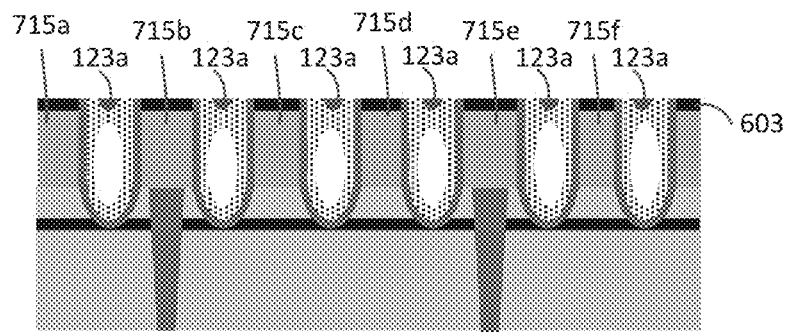
FIG. 11 illustrates the memory die of FIG. 10 after planarization to expose dummy bit lines.

FIG. 11 shows the results of planarization (e.g. etching back) the structure of FIG. 10. Much of the filling layer 123 is removed (with some isolated portions 123a-f remaining in depressions). In other cases all of the filling layer may be removed at this point. The liner layer 123 is removed from over buffering layer 603 so that the buffering layer portions are exposed at this stage. Separate air gap structures remain in trenches. A suitable etch chemistry may be used so that the buffering layer 603 acts as an etch stop layer or as an end-point layer. For example, where the buffering layer is formed of silicon nitride, an etch chemistry may be selective to silicon oxide over silicon nitride (i.e. has a higher etch rate for silicon oxide than silicon nitride). When the etch reaches the buffering layer 603 some change may be detected in the etch process so that a determination may be made to stop etching (e.g. some characteristic byproduct may be detected, or some optical or other parameter may change). A buffering layer may be used as either an etch stop layer, or an end-point layer, or a combination of both (e.g. the etch rate may be lower and some change may occur when the buffer layer is encountered so that etching can be stopped). By stopping accurately at the level of the buffering layer damage to air gap structures may be avoided (i.e. the risk of over-etching and exposing air gaps is reduced or eliminated).

Figure 12:
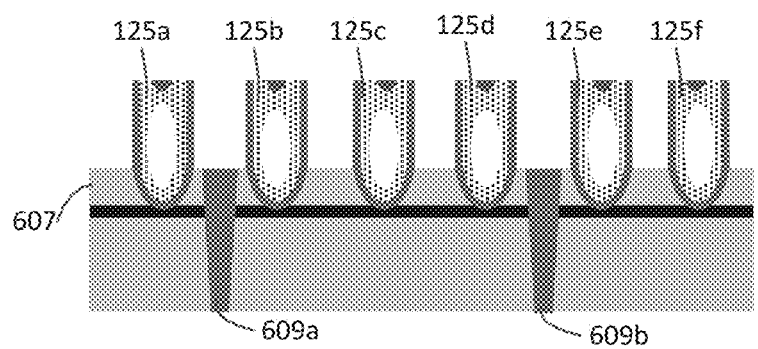
FIG. 12 illustrates the memory die of FIG. 11 after removal of dummy bit lines.

FIG. 12 shows the memory die of FIG. 11 after removal of dummy bit lines including the buffering layer. This may be performed in two separate steps. For example, a selective etch may remove a buffering layer of silicon nitride using phosphoric acid (H3PO4) without significantly etching a sacrificial layer of amorphous silicon. Subsequently, amorphous silicon may be selectively removed using hot TMY (Trimethyl(2-hydroxyethyl)ammonium hydroxide, ([(CH3)3N(CH2CH2OH)]+OH—)) without significantly etching underlying silicon oxide layer. This provides uniform etch depth across the substrate. This leaves air gap structures 125a-f separated by gaps that correspond to bit lines (i.e. gaps where dummy bit lines were removed). It can be seen that air gap structures 125a-f extend lower than the bottom of these gaps (i.e. lower than upper surface of dielectric layer 607).

Figure 13:
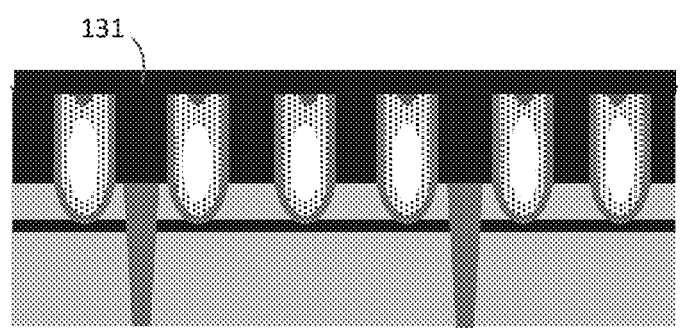
FIG. 13 illustrates the memory die of FIG. 12 after deposition of metal and barrier layers.

FIG. 13 shows the memory die of FIG. 12 after deposition of a conductive metal 131 such as copper or tungsten that fills gaps between air gap structures 125a-f. One or more barrier layers (not shown) may be deposited prior to deposition of conductive metal. For example, titanium nitride and titanium layers may form a barrier layer with conductive metal deposited over the barrier layer. Because air gaps are encapsulated no metal or barrier layer material enters air gaps so that air gaps remain air-filled.

Figure 14:
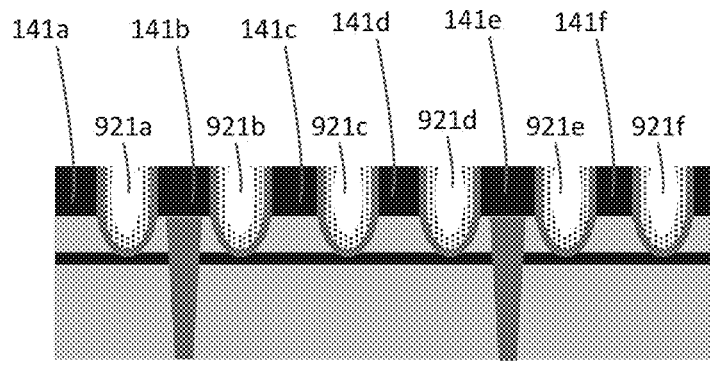
FIG. 14 illustrates the memory die of FIG. 13 after planarization.

FIG. 14 shows the memory die of FIG. 13 after a planarization step to remove excess metal 131 (and barrier layer if present) leaving bit lines 141a-f at locations where dummy bit lines 715a-f were previously located. Thus, FIGS. 11-14 show replacement of dummy bit lines 715a-f by bit lines 141a-f. Planarization may be performed by Chemical Mechanical Polishing (CMP). Air gaps 921a-f are shown being exposed (opened up to ambient air) by this planarization step (in other examples, planarization may stop before air gaps are exposed).

Figure 15:
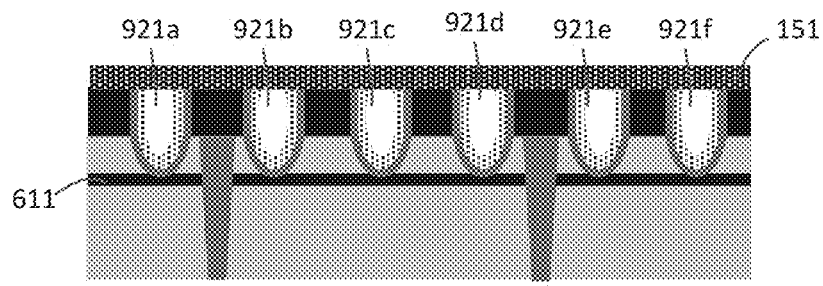
FIG. 15 illustrates the memory die of FIG. 14 after formation of a cap layer.

FIG. 15 shows the formation of a cap layer 151 that re-encapsulates air gaps 921a-f that have been exposed between bit lines. This isolates air gaps 921a-f during subsequent processing so that they are not filled with any subsequently deposited material and remain air-filled. It can be seen that encapsulated air gaps 921a-f extend between neighboring bit lines 141a-f and somewhat below the bottoms of bit lines 921a-f. This is in contrast to some other structures where air gaps only extend partially between bit lines (e.g. where only dielectric separates lower portions of bit lines. Bit line height is uniform because it was established by an interface between dummy bit lines formed of sacrificial material and underlying dielectric. Using an appropriate selective etch allows high uniformity when replacing dummy bit lines. Heights of air gap structures are also uniform because of etch stop layer 611. In other examples, sufficient uniformity may be achieved without an etch stop layer (e.g. by timed etch).

It can be seen in FIG. 15 that both bit lines and air gap structures between bit lines are formed and that no further exposure of bit lines to additional processing may be needed. Thus, bit lines formed by this process may not be exposed to etching. By forming bit lines later in the process, after air gap structures are already in place, exposure of bit lines to potentially damaging processing may be reduced or eliminated. In particular, no removal of sacrificial material from between bit lines (as in FIG. 4) is performed after bit lines are in place in this example.

Trench Profile

In some cases an etch process may be tuned to achieve a desired trench profile. FIG. 3 shows an example of a trench profile that tapers with increased depth and has a flat bottom. FIG. 7 shows an example of a trench profile with little or no tapering and a round bottom. In some cases, other profiles may be desirable so that structures may have particular geometries that may provide benefits.

Figure 16:
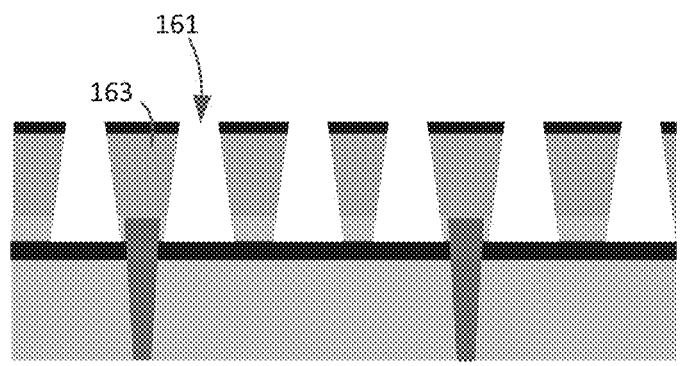
FIG. 16 illustrates dummy bit lines that have a tapered profile.

FIG. 16 shows an example of a trench profile (e.g. trench 161) that is flared so that it becomes wider with increasing depth. This produces dummy bit lines (e.g. dummy bit line 163) that taper with increased depth (i.e. that narrow as they go down). Such a flared trench profile may facilitate encapsulating air gaps by providing a relatively small opening at the tops of trenches which tend to become pinched off. This may increase the amount of air in an air gap structure compared with the amount of encapsulating material and thus provide improved isolation between bit lines. The tapered dummy bit line profile may also facilitate formation of good barrier and metal layers when dummy bit lines are replaced because the wider openings when dummy bit lines are removed promote void free filling. The geometry may be considered to favor voids (air gaps) between bit lines where they are desired and to disfavor voids (favor filling) within bit lines where voids are not desired.

In some cases, trench profiles such as shown in FIG. 16 may be achieved by tuning an etch process (e.g. tuning the etch process of FIGS. 6-7). In other cases, a different series of process steps may be used to achieve a trench profile like that shown in FIG. 16.

Figure 17:
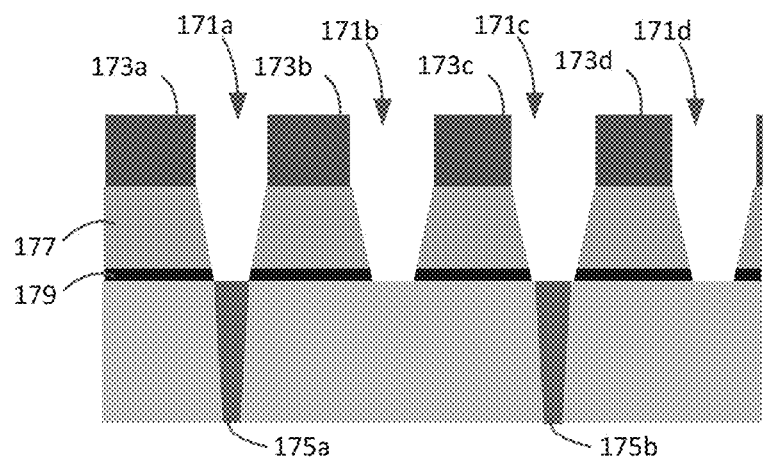
FIG. 17 illustrates an example of a memory die at an intermediate stage of fabrication with trenches formed in a first sacrificial material.

FIG. 17 shows another memory die at an intermediate stage of fabrication with trenches 171a-d formed where bit lines are later to be located. A patterned layer of hard mask portions 173a-d (e.g. amorphous silicon) establishes locations where trenches are to be formed and an etch process forms trenches 171a-d that taper with increasing depth (i.e. they are narrower at the bottom than at the top). This is similar to FIG. 3 with trenches 171a, 171c exposing vias 175a-b at locations where bit lines are to contact vias. In this case, trenches extend through a first sacrificial layer 177 and an etch stop layer 179 to expose vias 175a-b. The first sacrificial layer 177 may be formed of a first sacrificial material such as silicon nitride (SiN) and the etch stop layer may be formed of silicon oxide (e.g. formed by a CVD process using TEOS).

Figure 18:
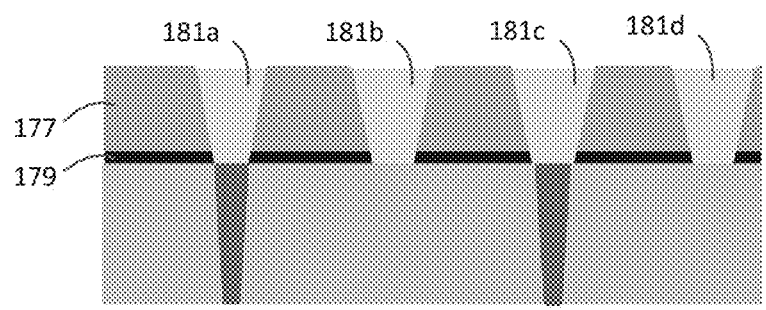
FIG. 18 illustrates the memory die of FIG. 17 after deposition and planarization of a second sacrificial material.

FIG. 18 shows the memory die of FIG. 17 after removal of hard mask portions 173a-d and deposition and etching back of a second sacrificial layer of a second sacrificial material to leave dummy bit lines 181a-d formed of the second sacrificial material. The second sacrificial material may be amorphous silicon. Thus, whereas FIGS. 6-7 show dummy bit lines formed by etching of a blanket layer of sacrificial material, here dummy bit lines 181a-d are formed by a damascene process that deposits the sacrificial material into trenches and then removes excess sacrificial material.

Figure 19:
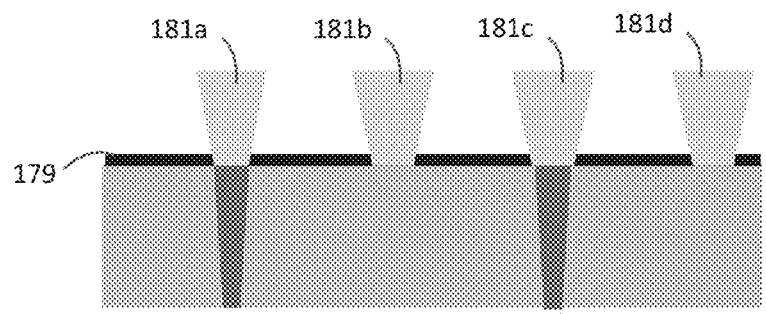
FIG. 19 illustrates the memory die of FIG. 18 after removal of the first sacrificial material to leave dummy bit lines.

FIG. 19 shows the memory die of FIG. 18 after removal of the first sacrificial layer 177 to leave dummy bit lines 181a-d. Removal of the first sacrificial layer 177 may stop on the etch stop layer 179 so that gaps between dummy bit lines have uniform depth. While dummy bit lines are exposed to this etch and may be affected by it, because they are dummy bit lines they are later replaced and the effects of any such damage are generally not significant (unlike damage to actual bit lines).

Figure 20:
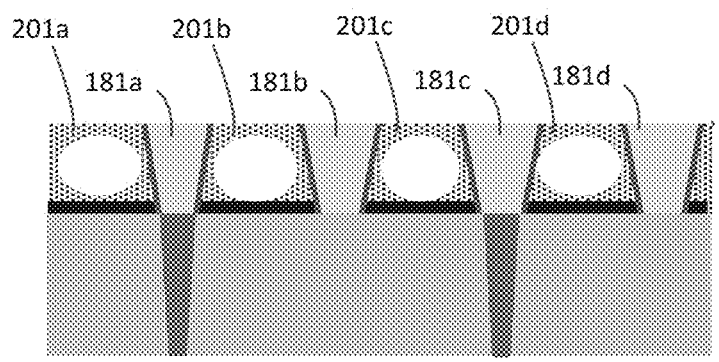
FIG. 20 illustrates the memory die of FIG. 10 after formation of air gap structures between dummy bit lines.

FIG. 20 shows the memory die of claim 19 after formation of air gap structures 201a-d between dummy bit lines 181a-d. Formation of air gap structures 201a-d may proceed as previously described, or may use different process steps. A liner layer may be deposited first, followed by an air gap encapsulating layer. Pinching off of openings between dummy bit lines 181a-d is facilitated by the relatively narrow openings provided by dummy bit line geometry. In some cases, a filling layer may be unnecessary over such an air gap structure because the encapsulating layer may provide sufficient protection for the air gap (no filling layer is shown in FIG. 20).

Figure 21:
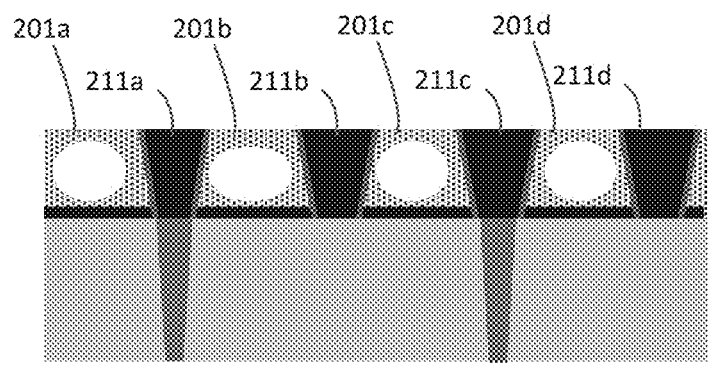
FIG. 21 illustrates the memory die of FIG. 21 after replacement of dummy bit lines with bit lines.

FIG. 21 shows the memory die of claim 20 after replacement of dummy bit lines 181a-d with bit lines 211a-d. This replacement may be performed as previously described including selective removal of dummy bit lines followed by deposition and planarization of barrier and metal layers. Deposition of barrier and metal layers may be facilitated by the geometry shown, which provides relatively wide openings at the top to allow good coverage of barrier material in such trenches and void free metal filling.

Figure 22:
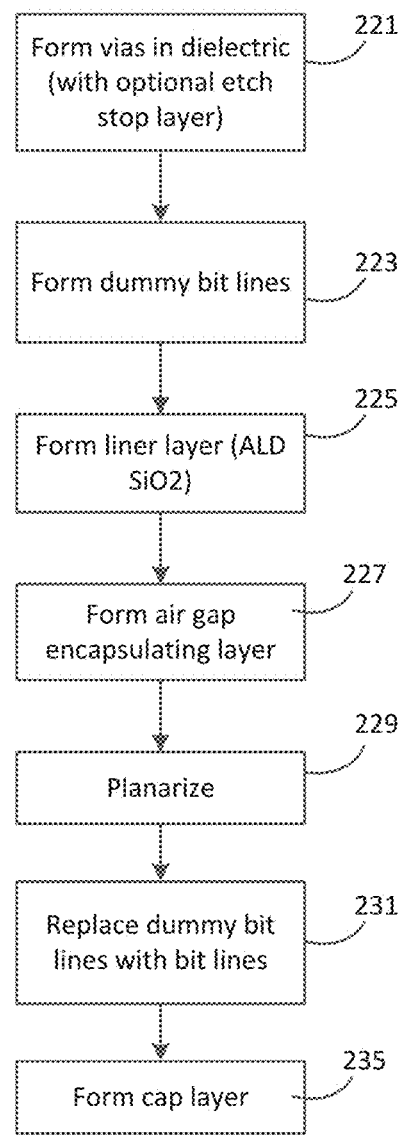
FIG. 22 shows process steps used to form bit lines separated by air gaps.

FIG. 22 illustrates an example of process steps that may be used to provide air gaps between bit lines. Vias are formed 221 in a dielectric layer over a memory array. An etch stop layer may be provided in the dielectric (i.e. the dielectric may be formed of a layer below the etch stop layer and a layer above the etch stop layer with the vias passing through both the dielectric and etch stop layers.) Dummy bit lines are formed 223 over the dielectric layer at locations where bit lines are subsequently to be formed. Dummy bit lines are aligned so that they overlie vias. Dummy bit lines may be formed in any suitable manner. Subsequently, a liner layer is deposited 225 (e.g. silicon dioxide deposited by ALD). Then, an air gap encapsulating layer is deposited 227 so that encapsulated air gaps are formed between bit lines. One or more additional layers such as a layer of filler material may be deposited. Then a planarization step 229 (e.g. CMP or etch back) removes excess encapsulating layer material and exposes dummy bit lines. Separate air gap structures are located between dummy bit lines at this point. Dummy bit lines are then replaced 231 with bit lines, for example by removing dummy bit lines, depositing barrier layer material and conductive metal, and planarizing to leave bit lines where dummy bit lines were removed. Then, a cap layer may be deposited 235 to cover any air gaps that may have been exposed during planarization.

Figure 23:
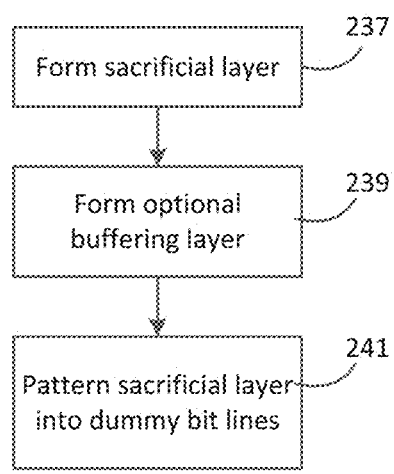
FIG. 23 shows an example of steps used to form dummy bit lines.

FIG. 23 illustrates process steps in one example of dummy bit line formation (i.e. one example of step 223 of FIG. 22). A sacrificial layer is formed 237 (e.g. amorphous silicon). An optional buffering layer (e.g. silicon nitride) may be formed on the sacrificial layer 239. Subsequently, the sacrificial layer is patterned into dummy bit lines 241.

Figure 24:
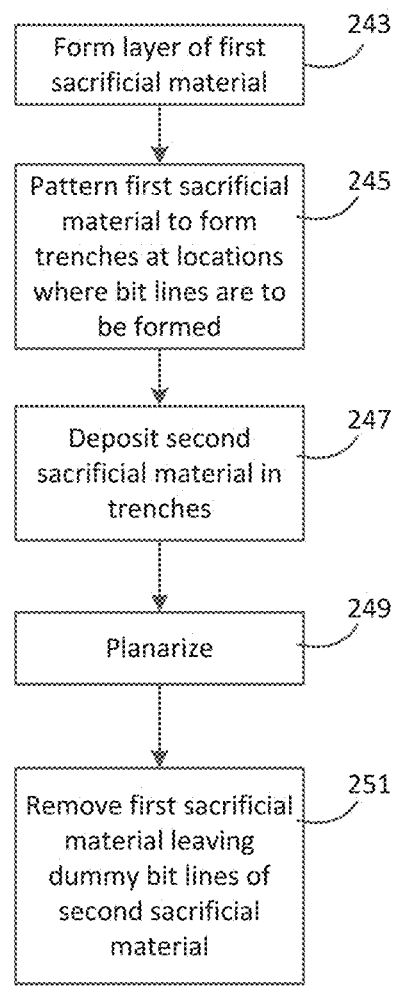
FIG. 24 shows another example of steps used to form dummy bit lines.

FIG. 24 illustrates process steps in another example of dummy bit line formation (i.e. another example of step 223 of FIG. 22). A layer of a first sacrificial material is formed 243. Then the first sacrificial material is patterned 245 to form trenches at locations where bit lines are to be formed. A second sacrificial material is deposited 247 in the trenches formed in the first sacrificial material. A planarization step 249 removes second sacrificial material to expose the first sacrificial material. Then, the first sacrificial material is removed 251 leaving dummy bit lines of the second sacrificial material.

CONCLUSION

Although the various aspects have been described with respect to particular examples, it will be understood that protection within the full scope of the appended claims is appropriate. Furthermore, although the present description teaches methods for implementation with respect to particular prior art structures, it will be understood that the present claims are entitled to protection when implemented in memory arrays with architectures other than those described.

It is claimed:

1. A method of forming air gap structures between conductive lines, the method comprising:
   forming a first layer;
   forming a second layer on the first layer;
   patterning the second layer using a selective etch that provides an etch rate of the second layer that is substantially higher than an etch rate of the first layer thereby forming a first trench in the second layer at a location where an air gap between conductive lines is to be formed, the first trench extending through the second layer and stopping on the first layer;
depositing a third layer in the first trench the third layer encapsulating an air gap in the first trench;
removing the patterned second layer to form a second trench while the air gap remains in place;
depositing a barrier layer and conductive line metal in the second trench; and
performing Chemical Mechanical Polishing (CMP) to remove excess conductive line material while leaving conductive line material in the second trench to form a conductive line wherein performing the CMP removes material down to a level that is lower than an uppermost point in the air gap thereby exposing the air gap, the method further comprising subsequently depositing a capping layer to re-enclose the air gap.

2. The method of claim 1 further comprising removing at least a portion of the third layer prior to removing the patterned second layer.

3. The method of claim 2 wherein the at least a portion of the third layer that is removed extends over the patterned second layer and wherein removing the at least a portion of the third layer exposes the patterned second layer.

4. The method of claim 1 wherein the first trench extends into the first layer and ends within the first layer.

5. The method of claim 4 wherein the first trench extends lower than a bottom surface of the conductive line.

6. The method of claim 1 further comprising:
forming a buffering layer on the second layer, and
prior to removing the patterned second layer to form the second trench, removing excess material of the third layer from over the buffering layer on the patterned second layer using an etch that has a significantly higher etch rate for material of the third layer than for material of the buffering layer.

7. The method of claim 1 wherein the third layer is a composite layer formed of two or more individual layers and wherein formation of the third layer comprises:
depositing an encapsulating layer in the first trench; and
subsequently depositing a filling layer over the encapsulating layer, the filling layer having a higher filling efficiency than the encapsulating layer.

8. The method of claim 1 wherein the selective etch uses an etch chemistry that has a significant etch rate for material of the barrier layer.

9. The method of claim 8 wherein the etch chemistry is such that the selective etch is corrosive to material of the barrier layer.

10. The method of claim 1 wherein the barrier layer comprises titanium.

11. The method of claim 1 wherein the first trench is shaped so that width of the first trench increases with increasing depth.

12. The method of claim 1 wherein performing the CMP removes material down to a level that is higher than the air gap and does not expose the air gap.

13. A method of forming bit lines of a nonvolatile memory comprising:
forming a plurality of dummy bit lines in a sacrificial layer of sacrificial material at locations where a plurality of bit lines are to be formed, the plurality of dummy bit lines separated by a plurality of trenches that extend through the sacrificial layer;
subsequently forming a plurality of enclosed air gap structures in the plurality of trenches wherein forming the plurality of enclosed air gap structures in the plurality of trenches comprises:
forming a liner layer on exposed surfaces of the trenches;
subsequently forming an air gap encapsulating layer on the liner layer;
subsequently forming a cap layer on the encapsulating layer; and
subsequently performing an etch back step; and
subsequently replacing the plurality of dummy bit lines with metal to form the plurality of bit lines.

14. The method of claim 13 wherein replacing the plurality of dummy bit lines comprises:
performing a selective etch to remove the plurality of dummy bit lines without significant etching of an underlying layer and without significant etching of the plurality of enclosed air gap structures;
subsequently depositing a layer of metal that fills openings where dummy bit lines were removed and that overlies the plurality of enclosed air gap structures; and
subsequently performing planarization to remove excess metal while leaving metal in the openings to form the plurality of bit lines.

15. The method of claim 14 wherein the planarization removes material of the plurality of enclosed air gap structures and further comprising depositing a cap layer to re-enclose the plurality of enclosed air gap structures.

16. The method of claim 13 wherein the trenches extend through an underlying layer that underlies the sacrificial layer, the trenches stopping at an etch stop layer located below the underlying layer, the underlying layer and etch stop layer formed of different materials that are not the sacrificial material.

17. The method of claim 16 wherein the sacrificial material is amorphous silicon, the underlying layer is formed of silicon oxide and the etch stop layer is formed of silicon nitride.

18. The method of claim 17 wherein replacing the dummy bit lines comprises:
etching substantially all amorphous silicon of the sacrificial layer using an etch that selectively removes amorphous silicon without substantially etching the underlying layer of silicon oxide; and
subsequently depositing the metal on the underlying layer of silicon oxide.

19. The method of claim 13 wherein forming the plurality of dummy bit lines of sacrificial material at locations where the plurality of bit lines are to be formed comprises:
patterning an underlying sacrificial layer to form elongated openings in the underlying sacrificial layer at locations where the plurality of bit lines are to be formed;
filling the elongated openings with the sacrificial material;
planarizing the sacrificial material; and
removing the underlying sacrificial layer to leave the dummy bit lines.

20. The method of claim 13 wherein forming the plurality of dummy bit lines of sacrificial material at locations where the plurality of bit lines are to be formed comprises:
depositing a sacrificial layer of the sacrificial material; and
subsequently patterning and etching the sacrificial layer into the plurality of dummy bit lines.

21. A method of forming bit lines of a nonvolatile memory comprising:
forming a first sacrificial layer of a first sacrificial material;

patterning the first sacrificial layer of the first sacrificial material to form a first plurality of trenches at locations where bit lines are to be formed;

subsequently depositing a second sacrificial material in the first plurality of trenches and over the patterned first layer of the first sacrificial material;

subsequently planarizing the second sacrificial layer to expose portions of the first sacrificial layer;

selectively removing the first sacrificial material to leave portions of the second sacrificial material as dummy bit lines at locations where bit lines are to be formed;

subsequently forming a plurality of enclosed air gap structures between dummy bit lines; and subsequently replacing dummy bit lines with metal to form the bit lines.

22. The method of claim 21 wherein the first plurality of trenches are tapering trenches that become narrower as with increasing depth.

23. The method of claim 21 wherein the plurality of enclosed air gap structures are wider along a bottom surface than along a top surface.

24. The method of claim 21 further comprising patterning an etch stop layer that underlies the first sacrificial layer with the first sacrificial layer so that the first plurality of trenches extend through the etch stop layer.

25. The method of claim 24 wherein forming the first plurality of trenches exposes portions of an underlying dielectric layer and exposes vias in the underlying dielectric layer.

26. The method of claim 25 wherein the first sacrificial material is silicon nitride, the second sacrificial material is amorphous silicon, the etch stop layer is formed of silicon oxide, and the underlying dielectric layer is formed of silicon oxide.

* * * * *